United States Patent
Shibata

(10) Patent No.: US 11,201,261 B2
(45) Date of Patent: Dec. 14, 2021

(54) DEEP ULTRAVIOLET LIGHT EMITTING ELEMENT AND METHOD OF MANUFACTURING THE SAME

(71) Applicant: DOWA Electronics Materials Co., Ltd., Tokyo (JP)

(72) Inventor: Tomohiko Shibata, Akita (JP)

(73) Assignee: DOWA Electronics Materials Co., Ltd., Tokyo (JP)

(*) Notice: Subject to any disclaimer, the term of this patent is extended or adjusted under 35 U.S.C. 154(b) by 52 days.

(21) Appl. No.: 16/482,138

(22) PCT Filed: Feb. 14, 2018

(86) PCT No.: PCT/JP2018/005087
§ 371 (c)(1),
(2) Date: Jul. 30, 2019

(87) PCT Pub. No.: WO2018/151157
PCT Pub. Date: Aug. 23, 2018

(65) Prior Publication Data
US 2019/0393381 A1 Dec. 26, 2019

(30) Foreign Application Priority Data
Feb. 17, 2017 (JP) ............................. JP2017-028385

(51) Int. Cl.
*H01L 33/18* (2010.01)
*H01L 33/10* (2010.01)
(Continued)

(52) U.S. Cl.
CPC ............ *H01L 33/18* (2013.01); *H01L 33/10* (2013.01); *H01L 33/305* (2013.01)

(58) Field of Classification Search
CPC ... H01L 33/007; H01L 33/0075; H01L 33/10; H01L 33/18; H01L 33/305; H01L 33/32;
(Continued)

(56) References Cited

U.S. PATENT DOCUMENTS 9,153,741 B1* 10/2015 Hirayama ............... H01L 33/32
2005/0110037 A1* 5/2005 Takeda ................... H01L 21/42
257/103
(Continued)

FOREIGN PATENT DOCUMENTS

JP H0897468 A 4/1996
JP 2002094110 A 3/2002
(Continued)

OTHER PUBLICATIONS

Apr. 10, 2018, International Search Report issued in the International Patent Application No. PCT/JP2018/005087.
(Continued)

*Primary Examiner* — Omar F Mojaddedi
(74) *Attorney, Agent, or Firm* — Kenja IP Law PC

(57) ABSTRACT

Provided are a deep ultraviolet light emitting element that exhibits both high light output power and an excellent reliability, and a method of manufacturing the same. A deep ultraviolet light emitting element 100 of this disclosure comprises an n-type semiconductor layer 30, a light-emitting layer 40, and a p-type semiconductor layers 60, on a substrate 10, in this order. The light-emitting layer 40 emits deep ultraviolet light. The p-type semiconductor layers 60 comprise a p-type first layer 60A and a p-type contact layer 60B directly on the p-type first layer 60A. The p-type contact layer 60B is made of a non-nitride p-type group III-V or p-type group IV semiconductor material, and functions as a reflective layer to reflect the deep ultraviolet light. The reflectance of light at a wavelength of 280 nm incident on (Continued)

the p-type contact layer 60B from the p-type first layer 60A is 10% or higher.

6 Claims, 6 Drawing Sheets

(51) Int. Cl.
*H01L 33/30* (2010.01)
*H01L 33/06* (2010.01)
*H01L 33/14* (2010.01)
*H01L 33/26* (2010.01)

(58) Field of Classification Search
CPC ....... H01L 33/06; H01L 33/04; H01L 33/025; H01L 33/145; H01L 33/405; H01L 33/0025; H01L 33/12; H01L 33/20; H01L 33/22; H01L 33/38; H01L 33/14; H01L 33/385; H01L 33/0054; H01L 33/0058; H01L 33/34; H01L 33/346; H01L 33/0062; H01L 33/0079; H01L 33/002; H01L 33/30; H01L 33/325
See application file for complete search history.

(56) References Cited

U.S. PATENT DOCUMENTS

| | | | |
|---|---|---|---|
| 2010/0025712 A1 | 2/2010 | Weyers et al. | |
| 2012/0326169 A1* | 12/2012 | Sakai | H01L 33/007 257/79 |
| 2013/0016749 A1* | 1/2013 | Motoda | H01S 5/1071 372/45.01 |
| 2016/0005919 A1* | 1/2016 | Obata | H01L 33/0025 257/13 |
| 2016/0027978 A1* | 1/2016 | Shih | H01L 33/0095 257/13 |
| 2016/0284941 A1* | 9/2016 | Seo | H01L 33/42 |
| 2019/0140137 A1* | 5/2019 | Kim | H01L 33/04 |
| 2019/0267514 A1* | 8/2019 | Choi | H01L 33/06 |

FOREIGN PATENT DOCUMENTS

| | | |
|---|---|---|
| JP | 2012248625 A | 12/2012 |
| JP | 2015185655 A | 10/2015 |
| JP | 2015216352 A | 12/2015 |
| JP | 6039848 B1 | 12/2016 |

OTHER PUBLICATIONS

Mar. 24, 2020, Notification of Reasons for Refusal issued by the Japan Patent Office in the corresponding Japanese Patent Application No. 2018-568569.

Aug. 20, 2019, International Preliminary Report on Patentability issued in the International Patent Application No. PCT/JP2018/005087.

Jun. 2, 2020, Notification of Reasons for Refusal issued by the Japan Patent Office in the corresponding Japanese Patent Application No. 2018-568569.

\* cited by examiner

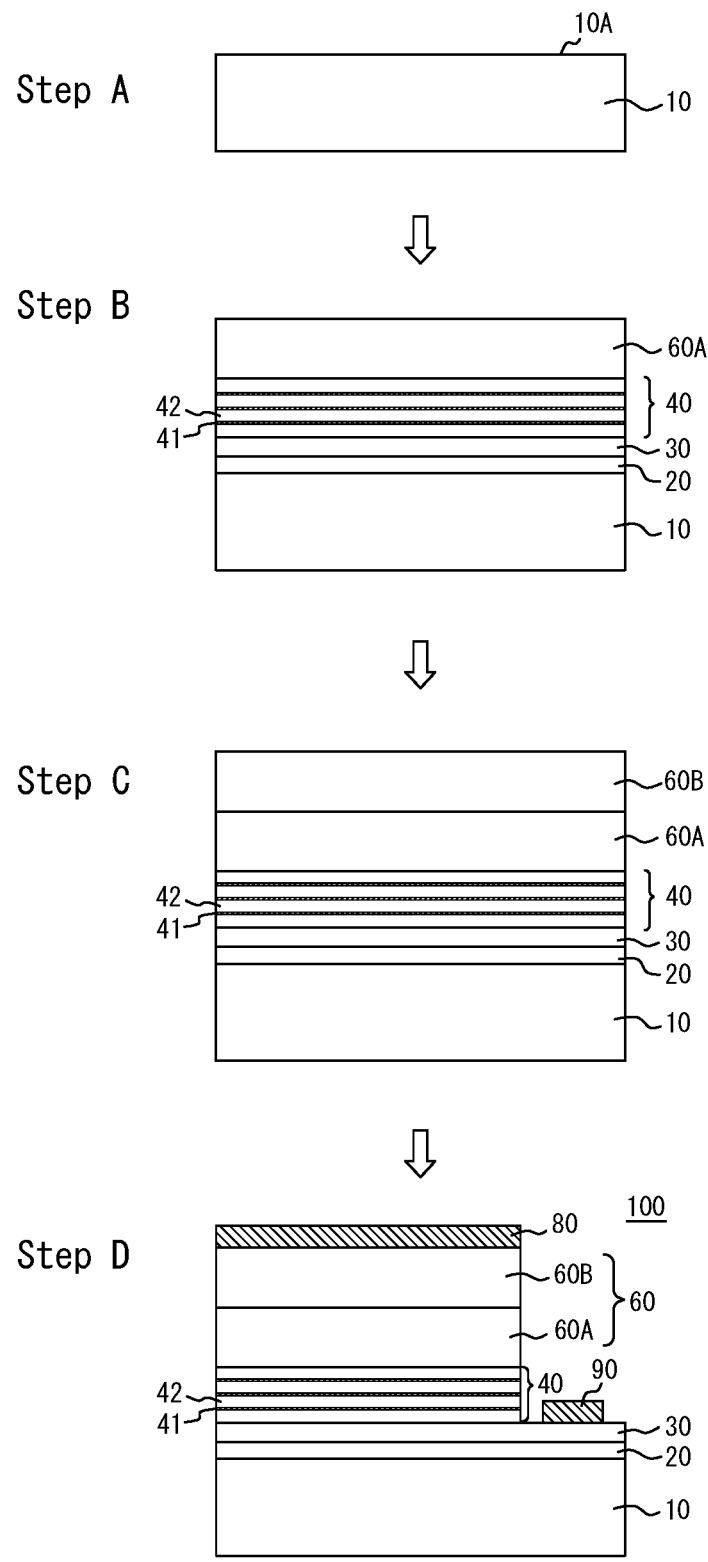

DEEP ULTRAVIOLET LIGHT EMITTING ELEMENT AND METHOD OF MANUFACTURING THE SAME

TECHNICAL FIELD

The present disclosure relates to a deep ultraviolet light emitting element and a method of manufacturing the same. Particularly, it relates to a deep ultraviolet light emitting element that exhibits both high light output power and an excellent reliability, and a method of manufacturing the same.

BACKGROUND

Group III nitride semiconductors made of a compound of N and group III elements (such as Al, Ga, and In), i.e., wide-bandgap semiconductors having direct gap band structures, have been expected as promising materials for a wide variety of applications, including sterilization, water purification, medicine, illumination, and high-density optical recording. Of these, light emitting elements having light emitting layers made of group III nitride semiconductors can be provided for wide wavelength ranges from deep ultraviolet light to visible light, by adjusting the composition ratios of the group III elements. Therefore, their applications to a wide variety of light sources have been sought.

Light at wavelengths of 200 nm to 350 nm is referred to as "deep ultraviolet light", and deep ultraviolet light emitting elements that emit deep ultraviolet light are usually fabricated in the following procedure. Specifically, on a substrate made of sapphire or single-crystalline MN, a buffer layer is formed, and an n-type semiconductor layer, a light-emitting layer, and a p-type semiconductor layer, each made of a group III nitride semiconductor, are then formed in this order. Subsequently, an n-side electrode and a p-side electrode are formed, which electrically couple to the n-type semiconductor layer and the p-type semiconductor layer, respectively. In order to establish an ohmic contact, a p-type GaN contact layer is typically formed on the p-side electrode side of the p-type semiconductor layer. This is because the hole density can be easily increased in p-type GaN. For the light-emitting layer, a multiple quantum well (MQW) structure is widely used, in which a barrier layer and a well layer, each made of a group III nitride semiconductor, are alternately laminated.

Here, one of characteristics required for deep ultraviolet light emitting elements is a high external quantum efficiency. The external quantum efficiency is determined by: (i) the internal quantum efficiency, (ii) the electron influx efficiency, and (iii) the light extraction efficiency.

Patent Literature 1 (JP2015216352A) discloses a deep ultraviolet light-emitting diode comprising a p-type contact layer made of AlGaN mixed crystal and a p-side reflection electrode that is reflective to radiated light from a light-emitting layer, from which light is extracted from the substrate side. JP2015216352A discusses that the transmittance of the p-type contact layer to short-wavelength light increases with an increase in the Al composition ratio of the p-type contact layer made of AlGaN. Accordingly, in place of p-type contact layers made of GaN that have been widely used, JP2015216352A proposes to use a p-type contact layer made of AlGaN, of which transmittance varies according to the emission wavelength. The teaching in JP2015216352A could be interpreted that, even if the p-type contact layer made of AlGaN reduces the hole density, an increased transmittance of a p-type contact layer to reflected light would significantly improve light extraction efficiency, which is expected to lead to an improvement in the external quantum efficiency as a whole.

CITATION LIST

Patent Literature

PTL 1: JP 2015-216352 A

SUMMARY

Technical Problem

JP2015216352A discusses that, higher transmittance of a p-type contact layer to radiated light is more preferred. This can be interpreted that a higher the Al composition ratio of the p-type contact layer is more preferred, according to the teaching in JP2015216352A. Our experiments, however, revealed that increasing the transparency to the center emission wavelengths of deep ultraviolet light emissions by increasing the Al composition ratio of a p-type contact layer in contact with a p-type electrode was not practical. More specifically, an increased Al composition ratio in a p-type contact layer permitted deep ultraviolet light emitting elements to exhibit light output power higher than those of conventional art, in short term. However, phenomena were often observed in which such deep ultraviolet light emitting elements did not lit on or their light output power significantly reduced after current was supplied to them for only several minutes. It was hypothesized that the phenomena were caused by abnormalities of the contact interface of the p-type contact layer and the p-side electrode. Therefore, the technique disclosed in JP2015216352A could increase the initial light output power but could not serve to maintain that light output power, which rendered the deep ultraviolet light emitting element unreliable.

An object of the present disclosure is therefore to provide a deep ultraviolet light emitting element that exhibits both high light output power and an excellent reliability, and a method of manufacturing the same.

Solution to Problem

We diligently studied ways to address the above challenges and focused on reflections of deep ultraviolet light at the interface of the p-type contact layer with the light-emitting layer, instead of those at the interface with the p-side electrode, which led to the present disclosure. Specifically, the subject matter of the present disclosure is as follows:

(1) A deep ultraviolet light emitting element comprising, in an order:
   a substrate;
   an n-type semiconductor layer;
   a light-emitting layer configured to emit deep ultraviolet light having a peak emission wavelength in a range of 200 nm or more and 350 nm or less; and
   p-type semiconductor layers, comprising:
   a p-type first layer that is made of p-type $Al_xGa_{1-x}N$ having an Al composition ratio x ($0<x\leq1$) higher than an Al composition ratio of a layer to emit the deep ultraviolet light in the light-emitting layer; and
   a p-type contact layer directly on the p-type first layer, the p-type contact layer being made of a non-nitride p-type group III-V semiconductor material or a p-type group IV semiconductor material, the p-type contact layer being configured to function as a reflective layer to reflect the deep ultraviolet light, a reflectance of light at a wavelength of 280 nm incident on the p-type contact layer from the p-type first layer being 10% or higher.

(2) The deep ultraviolet light emitting element of (1), wherein the p-type contact layer has a thickness of 10 nm or more and 3000 nm or less.

(3) The deep ultraviolet light emitting element of (1), further comprising a metal reflective layer provided on the p-type contact layer, wherein the p-type contact layer has a thickness of 1 nm or more and less than 10 nm.

(4) The deep ultraviolet light emitting element of any one of (1)-(3), wherein the substrate is a sapphire substrate, an AlN template substrate, or a single-crystalline AlN substrate.

(5) A method of manufacturing a deep ultraviolet light emitting element that is configured to emit deep ultraviolet light having a peak emission wavelength in a range of 200 nm or more and 350 nm or less, the method comprising the steps of:

forming an n-type semiconductor layer on a substrate;

forming a light-emitting layer on the n-type semiconductor layer; and forming p-type semiconductor layers on the light-emitting layer, the step of forming the p-type semiconductor layers comprising:

a first step of forming a p-type first layer that is made of p-type $Al_xGa_{1-x}N$ having an Al composition ratio x ($0 < x \leq 1$) higher than an Al composition ratio of a layer to emit the deep ultraviolet light in the light-emitting layer; and a second step of forming, on the p-type first layer, a p-type contact layer made of a non-nitride p-type group III-V semiconductor material or a p-type group IV semiconductor material by MOCVD, the p-type contact layer being configured to function as a reflective layer to reflect the deep ultraviolet light, a reflectance of light at a wavelength of 280 nm incident on the p-type contact layer from the p-type first layer being 10% or higher.

Advantageous Effect

In accordance with the present disclosure, a deep ultraviolet light emitting element that exhibits both high light output power and an excellent reliability, and a method of manufacturing the same are provided.

BRIEF DESCRIPTION OF THE DRAWINGS

In the accompanying drawings:

FIG. 6 is a schematic cross-sectional view illustrating a method of manufacturing a deep ultraviolet light emitting element 100 according to an embodiment of this disclosure.

DETAILED DESCRIPTION

Figure 1:
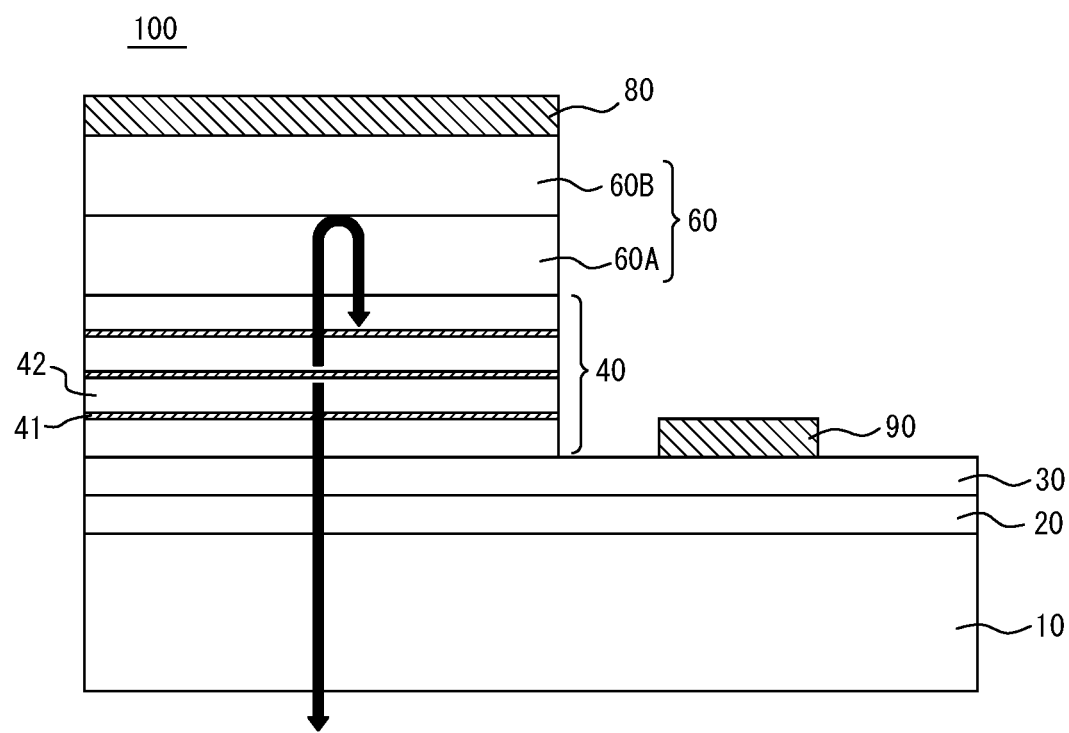
FIG. 1 is a schematic cross-sectional view illustrating a deep ultraviolet light emitting element 100 according to an embodiment of this disclosure.

Prior to describing embodiments of this disclosure, the following points are described beforehand. First, the term "AlGaN" alone for which the Al composition ratio is not specified means a given compound having a chemical composition ratio of group III elements (Al and Ga in total) with respect to N of 1:1 and any given ratio between the group III elements of Al and Ga. In this case, even if no reference is made to In that is a group III element, In may be contained at 5% or less with respect to the III elements of Al and Ga. In addition, the term "AlN" or "GaN" alone does not mean the composition ratio contains Ga or Al, respectively. Yet, the simple term "AlGaN" does not exclude AlN and GaN. Note that the value of the Al composition ratio can be measured for example by a photoluminescence measurement or an X-ray diffraction measurement.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Mg and Si and does not serve as an electrically p-type or n-type layer is referred to as an "i-type" or "undoped" layer. An undoped layer may contain impurities that are inevitably mixed in the production process. Specifically, when the carrier density is low (for example, less than $4 \times 10^{16}/cm^3$), the layer is regarded as being "undoped" in this specification. Further, the values of the impurity concentrations of Mg, Si, etc. are determined by SIMS analyses.

The total thickness of the epitaxially grown layers can be measured using an interference thickness measurement system. Further, when the composition ratios of the adjacent layers are sufficiently different (for example, the Al composition ratio differs by 0.01 or more), the thickness of each layer can be calculated by observing the cross sections of the grown layers using a transmission electron microscope (TEM). The boundary between two adjacent layers that have the same or substantially the same Al composition ratios (for example, the difference is less than 0.01) but have different impurity concentrations, and the thicknesses of these layers can be determined based on TEM-EDS. The impurity concentrations of these layers can be measured by SIMS analyses. When each of layers is thin as in the case of superlattice structures, the thickness can be measured using TEM-EDS.

Embodiments of the present disclosure will now be described with reference to the drawings. In principle, like components are denoted by the same reference numerals, and the description of those components will not be repeated. A substrate and layers in each diagram are exaggerated for the sake of explanation, so that the mode ratio does not conform to the actual ratio.

(Deep Ultraviolet Light Emitting Element 100)

Referring to FIG. 1, a deep ultraviolet light emitting element 100 according to an embodiment of this disclosure comprises an n-type semiconductor layer 30, a light-emitting layer 40, and p-type semiconductor layers 60, in this order, on a substrate 10, and optionally includes other components. The light-emitting layer 40 in the deep ultraviolet light emitting element 100 is configured to emit deep ultraviolet light having a peak emission wavelength in the deep ultraviolet range of 200 nm or more and 350 nm or less. This embodiment is more effectively applied for a deep ultraviolet light emitting element having a center emission wavelength of 265 nm or more and 310 nm or less.

Additionally, as illustrated in FIG. 1, the deep ultraviolet light emitting element 100 according to this embodiment may comprise a buffer layer 20 if necessary, on the substrate 10, and can further comprise an n-side electrode 90 on a part of the n-type semiconductor layer 30 and a p-side electrode 80 on the p-type semiconductor layer 60. The deep ultraviolet light emitting element 100 is a light-emitting element allowing extraction of light in the direction from the light-emitting layer 40 to the n-type semiconductor layer 30, and may be configured in a flip-chip type, for example.

Hereinafter, referring to FIG. 1, a p-type contact layer 60B in the p-type semiconductor layers 60, which is one of the characteristic features of the deep ultraviolet light emitting element 100 according to an embodiment, will be described together with the technical significance of the present disclosure.

<p-Type Semiconductor Layer>

The p-type semiconductor layers 60 comprise a p-type first layer 60A and a p-type contact layer 60B directly on the p-type first layer 60A. The p-type semiconductor layers 60 may further comprise an additional p-type layer other than the p-type first layer 60A and the p-type contact layer 60B, between the light-emitting layer 40 and the p-type first layer 60A. Here, the p-type first layer is made of p-type $Al_xGa_{1-x}N$ having an Al composition ratio x ($0<x\leq1$) higher than the Al composition ratio of a layer(s) to emit deep ultraviolet light in the light-emitting layer 40. In general, the p-type first layer 60A is configured to function as an electron blocking layer, or a p-type cladding layer or a part thereof. Detailed modes of the p-type first layer 60A will be described later.

<p-Type Contact Layer>

The p-type contact layer 60B according to this embodiment is made of a non-nitride p-type group III-V semiconductor material or a p-type group IV semiconductor material. The p-type contact layer 60B is configured to function as a reflective layer to reflect deep ultraviolet light from the light-emitting layer 40, and the reflectance of light at a wavelength of 280 nm incident on the p-type contact layer 60B from the p-type first layer 60A is 10% or higher.

Examples of the non-nitride p-type semiconductor material that can be used include compound semiconductors made of Al, Ga, or In, which are group III elements, and P, As, or Sb, which are group V element, and doped with p-type impurities. Examples of such III-V semiconductor materials include binary compound semiconductor materials, such as GaAs, GaP, InP, and InSb; ternary compound semiconductor materials, such as InGaAs and AlGaAs; and quaternary compound semiconductor materials, such as InGaAsP and AlInAsP. As the group IV semiconductor material, Si or Ge alone, or SiGe mixed crystals doped with p-type impurities may be used. Si and Ge serve as n-type carriers in a group III nitride layer, and affect the adjacent p-type first layer 60A. Therefore, the p-type contact layer 60B is more desirably made of a non-nitride III-V semiconductor material.

In this specification, the reflectance of light at a wavelength of 280 nm, which is an intermediate wavelength in the deep ultraviolet range (wavelengths of 200 nm to 350 nm). The reflectance of light at a wavelength of 280 nm incident on the p-type contact layer 60B from the p-type first layer 60A is calculated by the following Equation (1) from the refractive index ($n_1$) and the attenuation coefficient ($k_1$) of the p-type first layer and the refractive index ($n_c$) and the attenuation coefficient ($k_c$) of p-type contact layer:

Eq. 1

$$(\text{Reflectance}) = \frac{|n_1 - n_c|^2 + |k_1 - k_c|^2}{|n_1 + n_c|^2 + |k_1 + k_c|^2} \quad (1)$$

Note that the symbols are absolute value symbols.

The refractive indices $n_1$ and $n_c$ and attenuation coefficients $k_1$ and $k_c$ of the those materials can be measured using single-crystalline substrates of materials of interest, or thick films of the materials of interest, formed on substrates with known values by an ultraviolet-visible spectrometer, and the reflectance is calculated using the measured values. Alternatively, refractive indices and attenuation coefficients obtained from the website of Filmetrics, Inc. or disclosed in literatures may be used as approximate values.

When the refractive index $n_1$ of the p-type first layer 60A ($Al_xGa_{1-x}N$) is unknown, an approximate value thereof may be calculated as a some middle value of the refractive indices of AlN and GaN by applying a weight proportional to the Al composition ratio x, for example.

If the attenuation coefficient $k_1$ of the p-type first layer 60A ($Al_xGa_{1-x}N$) is unknown, an approximate value of the attenuation coefficient $k_1$ may be determined as follows:

(1) When the Al composition ratio x of the p-type first layer is greater than 0.45, the p-type first layer 60A is transparent to deep ultraviolet light at a wavelength of 280 nm. Therefore, the attenuation coefficient of AlN of 0.001 may be used as the attenuation coefficient $k_1$.

(2) When the Al composition ratio x of the p-type first layer is not greater than 0.45, the attenuation coefficient $k_1$ of the p-type first layer 60A needs to be measured.

The semiconductor material composing the p-type contact layer 60B has an even narrower band gap than that of p-type GaN, and hence it might be commonly acknowledged that it would absorb deep ultraviolet light (or it would emit deep ultraviolet light as a secondary source) from its band gap. In reality, however, the reflectances at an interface of AlGaN and AlGaAs and at an interface of AlGaN and InAs or GaInSb are much greater than the reflectance at an interface of AlGaN and GaN, which is about 1% when the refractive indices of the p-type first layer 60A and the p-type contact layer 60B are taken into consideration. We reached the conclusion as follows. A p-type contact layer 60B made of a semiconductor material having a reflectance of light at a wavelength of 280 nm of 10% or higher, and preferably 15% or higher for allowing for the effects of the crystallinity and flatness, can be used as a reflective layer of deep ultraviolet light.

We then studied on possible materials to be used for such a p-type contact layer 60B which satisfied the following:
<1> The reflectance is high, which is attributed from the refractive index at an interface with a p-type first layer 60A made of p-type $Al_xGa_{1-x}N$;
<2> The interface resistance is not high;
<3> p-type impurities can be more easily doped and the bulk resistance is smaller as compared to GaN;
<4> The negative effect of impurity diffusion on p-type $Al_xGa_{1-x}N$ is smaller;
<5> There is any material that is compatible with the material for a p-type contact layer 60B and can be used to form a p-side electrode having a small contact resistance; and
<6> The p-side electrode can be formed with practical methods.

We found advantages of employing non-nitride p-type group III-V semiconductors or p-type group IV semiconductor materials according to the present embodiment to form the p-type contact layer 60B from the perspective of these <1> to <6>, thereby conceiving of this disclosure. Therefore, the deep ultraviolet light emitting element 100 according to this embodiment has higher light output power and has smaller time derivation of the light output power than deep ultraviolet light emitting elements having conventional p-type GaN contact layers. In this manner, the p-type contact layer 60B according to the present disclosure enables to provide a deep ultraviolet light emitting element that exhibits both high light output power and an excellent reliability.

The p-type contact layer 60B formed from a p-type group 111-V semiconductor material or a p-type group IV semiconductor material described above can exhibit a function as a reflective layer as the intrinsic property thereof, without requiring a highly resistive structure, such as a distributed Bragg reflector (DBR). In other words, the p-type contact layer 60B is configured to function as a reflective layer to reflect deep ultraviolet light, in addition to the function to establish the contact.

In addition, although the above-described semiconductor materials for the p-type contact layer 60B, such as GaAs, have high reflectances in the deep ultraviolet range, they have low reflectances in the visible light range (400 nm or longer), such as blue or violet light. This behavior in the ultraviolet range enables the p-type contact layer 60B according to the present embodiment to serve as a reflective layer.

The p-type contact layer 60B may be single-crystalline or polycrystalline. Yet, a single-crystal is preferred since a single-crystalline p-type contact layer 60B can provide greater reflective effect than that of polycrystal.

Here, the thickness of the p-type contact layer 60B is preferably 10 nm or more and 3000 nm or less, and more preferably 1000 nm or less. A p-type contact layer 60B with a thickness of less than 10 nm is able to provide reflective effect. In contrast, the p-type contact layer 60B can be thick. There is not a particular limitation on the upper limit of the thickness of the p-type contact layer 60B, yet its reflective effect is saturated at a certain thickness. Therefore, the thickness of the p-type contact layer 60B can be determined as appropriate by taking the manufacturing cost and current diffusion, for example, into consideration. As compared to p-type GaN, the bulk resistance of the p-type contact layer 60B according to the present embodiment is smaller, and applied current is more likely to spread in the horizontal direction in the p-type contact layer 60B. Accordingly, as compared to conventional p-type GaN contact layers, the forward voltage is not increased with an increase in the thickness of the p-type contact layer 60B, and diffusion of current in the p-type contact layer 60B is also expected.

Figure 2A:
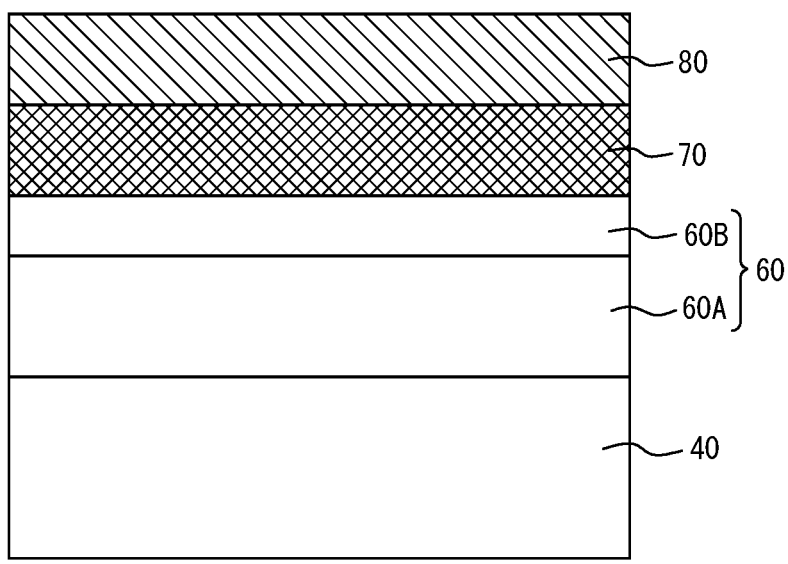
FIG. 2A is a schematic cross-sectional view illustrating a mode of a metal reflective layer 70 in the deep ultraviolet light emitting element 100 according to an embodiment of this disclosure.

Alternatively, when a metal reflective layer 70 is provided on the p-type contact layer 60B and metal reflective layer 70 serves for reflection together with the p-type contact layer 60B as illustrated in FIG. 2A, the thickness of the p-type contact layer 60B made of a non-nitride p-type group III-V semiconductor material or a p-type group IV semiconductor material can be set to 1 nm or more and less than 10 nm. A p-type contact layer 60B with a thickness of 1 nm or more and less than 10 nm can reduce absorption of light by the non-nitride p-type group III-V semiconductor material or the p-type group IV semiconductor material, as well as reducing the contact resistance. The combination of the p-type contact layer 60B and the metal reflective layer 70 thus ensures a suitable reflectivity in the deep ultraviolet wavelength range.

Figure 2B:
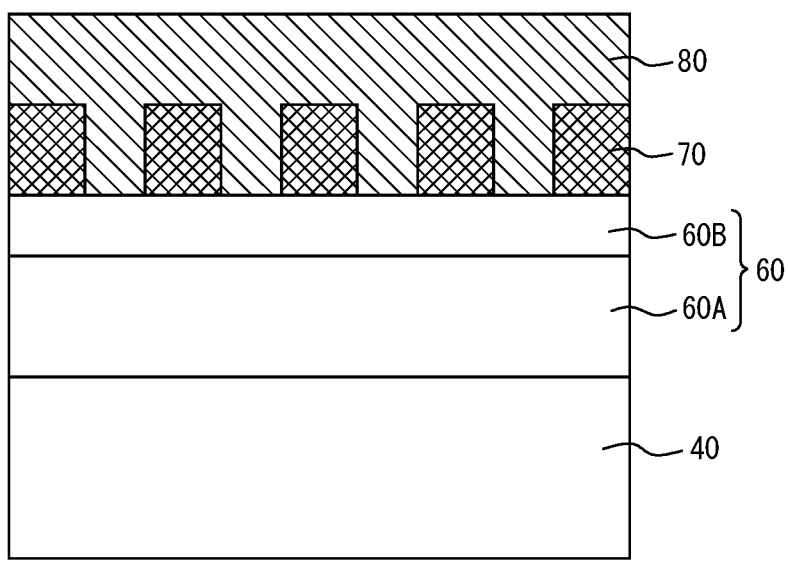
FIG. 2B is a schematic cross-sectional view illustrating another mode of a metal reflective layer 70 in the deep ultraviolet light emitting element 100 according to an embodiment of this disclosure.

Materials that can be used for the metal reflective layer 70 include Al and Rh that are capable of reflecting deep ultraviolet light at a wavelength of 280 nm. If the metal reflective layer 70 is in direct contact with the p-type first layer 60A in the absence of a p-type contact layer 60B interposed therebetween, the wide band gap of the p-type first layer 60A would increase the contact resistance. On the contrary, a p-type contact layer 60B with a narrow band gap interposed between the metal reflective layer 70 and the p-type first layer 60A can reduce the contact resistance. In this case, as illustrated in FIG. 2A, the metal reflective layer 70 may cover the entire surface of the p-type contact layer 60B. Alternatively, as illustrated in FIG. 2B, the metal reflective layer 70 having a certain pattern may be provided on the p-type contact layer 60B. Although FIG. 2B illustrates the example where the metal reflective layer 70 having the regularly spaced pattern is provided, it is matter of course that the metal reflective layer 70 in any other patterns may be provided.

The metal reflective layer 70 can be formed on the p-type contact layer 60B by a well-known thin film deposition technique, including evaporation and sputtering. The metal reflective layer 70 can have an arbitrary thickness, and may have a thickness of 10 nm or more and 500 nm or less, for example.

A p-type contact layer 60B with a thickness of several dozens to several hundreds of micrometers would apply an increased strain on and around the light-emitting layer induced by the lattice constant mismatch or the difference of the coefficients of thermal expansion of the p-type contact layer 60B and the underlying p-type $Al_xGa_{1-x}N$, which may result in a reduced reliability.

The p-type contact layer 60B may have a single- or multi-layered structure. The p-type contact layer 60B may be a composition gradient layer where the composition ratio of mixed crystal of the group III-V or group IV compound varies in the crystal growth direction. The material, composition, and dopant concentration of the p-type contact layer 60B may be varied between the vicinity of the light-emitting layer 40 expected to function as a reflective layer, and the vicinity of the p-side electrode 80 expected to reduce the contact resistance with the p-side electrode 80. More specifically, as long as the effects of the present disclosure are achieved by the reflectance at the interface of the p-type first layer 60A and the p-type contact layer 60B and a reduction in the contact resistance with the p-side electrode 80, the p-type group III-V or group IV semiconductor material may be formed into multiple layers or may be provided with a composition gradient. When the p-type contact layer 60B is formed into the multiple layers or is provided with the composition gradient, the reflectance of light at a wavelength of 280 nm incident on the p-type contact layer 60B from the p-type first layer 60A is calculated from the refractive index (no) and the attenuation coefficient ($k_c$) of the region of the p-type contact layer 60B which is in contact with the p-type first layer (the region within 50 nm from the interface). When the composition gradient is provided, the refractive indices and the attenuation coefficients at the interface and those at 50 nm from the interface are averaged, and the averages are used as the refractive index and the attenuation coefficient of the p-type contact layer 60B. When the p-type contact layer 60B is composed of multiple layers and a metal reflective layer 70 is provided on the non-nitride p-type group III-V semiconductor material or the p-type group IV semiconductor material for serving for reflection, the thickness of the non-nitride p-type group III-V semiconductor material or the p-type group IV semiconductor material may be set to 1 nm or more and less than 10 nm.

Carbon (C), beryllium (Be), magnesium (Mg), and zinc (Zn) may be used in alone or in combination as a p-type dopant in the p-type contact layer. Diffusion of Mg as the dopant from p-type AlGaN is considered as one of the causes of reduced light output power in deep ultraviolet light emitting elements. In prior art, Mg is doped in a p-type GaN contact layers at a high concentration for reducing the resistivity. This technique, however, has been concerned to negatively affect the reliability since Mg tends to diffuse to a light-emitting layer via the p-type AlGaN. In contrast, as compared to GaN contact layers, dopants can be activated more easily in the p-type contact layer 60B according to this embodiment. Accordingly, the dopant concentration needs not to be increased in the p-type contact layer 60B, which also can provide benefits of both low resistivity and higher reliability of the p-type contact layer.

Figure 3A:
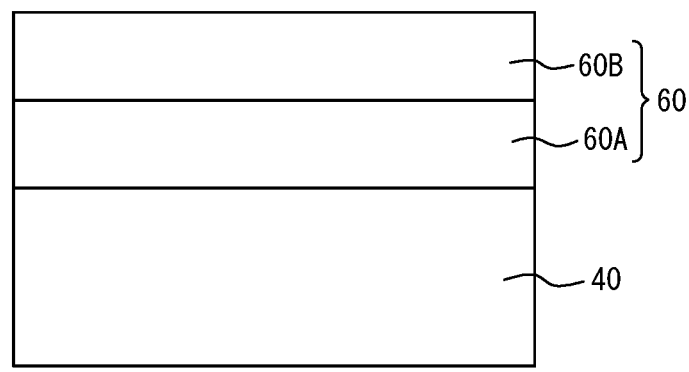
FIG. 3A is a schematic cross-sectional view illustrating a mode of p-type semiconductor layers 60 in the deep ultraviolet light emitting element 100 according to an embodiment of this disclosure.
Figure 3B:
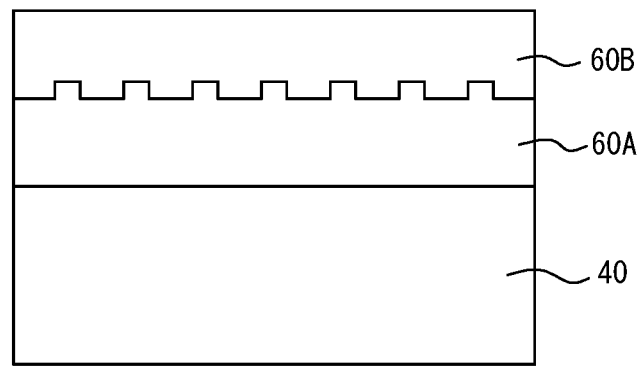
FIG. 3B is a schematic cross-sectional view illustrating another mode of p-type semiconductor layers 60 in the deep ultraviolet light emitting element 100 according to an embodiment of this disclosure.
Figure 3C:
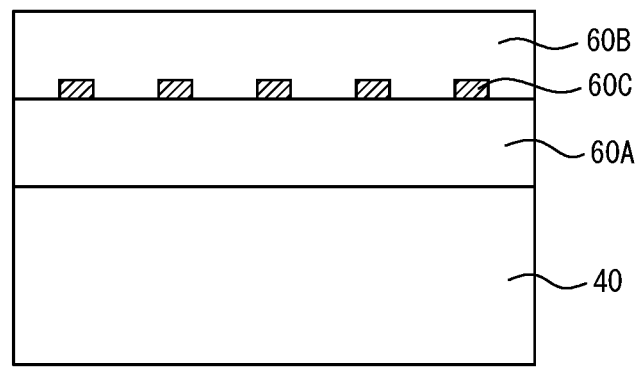
FIG. 3C is a schematic cross-sectional view illustrating a still another mode of p-type semiconductor layers 60 in the deep ultraviolet light emitting element 100 according to an embodiment of this disclosure.

Now referring to FIG. 3A, the interface of the p-type contact layer 60B and the p-type first layer 60A is typically formed flat. Alternatively, as illustrated in FIG. 3B, prior to formation of the p-type contact layer 60B, a part of the p-type first layer 60A may be provided with irregularities. Or, as illustrated in FIG. 3C, insulation regions 60C, such as patterned $SiO_2$ or voids, may be provided on a part of the interface. Such irregularities or the insulating regions are effective to disperse the current flow path.

The p-side electrode 80 on the p-type contact layer 60B may be formed from well-known materials that are compatible with the above-described materials used for the p-type contact layer 60B. For example, when the p-type contact layer 60B is made of p-type GaAs, an alloy containing AuZn or Ti/Pr/Au may be used.

In addition, components of the deep ultraviolet light emitting element other than the p-type contact layer 60B may be similar to those of well-known conventional deep ultraviolet light emitting element. Specific modes of components applicable to the present embodiment, from the substrate 10 to the p-type first layer 60A, will be described in the following. Yet, the following examples are not limitative, and any configurations may be employed.

<Substrate>

The substrate 10 is preferably a substrate that transmits light emitted by the light-emitting layer 40 thereby allowing for extraction of deep ultraviolet light from the substrate side, and may be a sapphire substrate or a single-crystalline AlN substrate, for example. Alternatively, an AlN template substrate may also be used as the substrate 10 in which an undoped AlN layer is epitaxially grown on the surface of a sapphire substrate.

<Buffer Layer>

On the substrate 10, a buffer layer 20 is preferably provided for reducing the lattice mismatch between the substrate 10 and the n-type semiconductor layer 30. The buffer layer 20 may be an undoped group III nitride semiconductor layer, or the buffer layer 20 in a superlattice structure is also preferred.

<n-Type Semiconductor Layer>

The n-type semiconductor layer 30 may be provided on the substrate 10, where the buffer layer 20 is interposed therebetween if necessary. The n-type semiconductor layer 30 may be provided directly on the substrate 10. The n-type semiconductor layer 30 may be a typical n-type layer, which can be made of AlGaN, for example. The n-type semiconductor layer 30 is doped with an n-type dopant, thereby functioning as an n-type layer.

Examples of the n-type dopant include silicon (Si), germanium (Ge), tin (Sn), sulfur (S), oxygen (O), titanium (Ti), and zirconium (Zr). The dopant concentration is not limited as long as the n-type semiconductor layer 30 can serve as an n-type layer. For example, the dopant concentration can be $1.0 \times 10^{18}$ atoms/$cm^3$ to $1.0 \times 10^{20}$ atoms/$cm^3$. In addition, the n-type semiconductor layer 30 preferably has a band gap that is wider than that of the light-emitting layer 40 (well layers 41 when a quantum well structure is used) and has a transparency to emitted deep ultraviolet light. The n-type semiconductor layer 30 may be composed of a single layer or a plurality of layers. Or, the n-type semiconductor layer 30 may be a composition gradient layer in which the composition ratio of the group III element has a gradient in the crystal growth direction, or may have a superlattice structure. The n-type semiconductor layer 30 functions to improve the crystallinity of the layers from the substrate to the light-emitting layer, as well as functioning to establish the contact with an n-type electrode.

<Light-Emitting Layer>

The light-emitting layer 40 is provided on the n-type semiconductor layer 30. The light-emitting layer 40 in the present embodiment is configured such that the light-emitting layer 40 emits light having a center emission wavelength in the deep ultraviolet light region of 200 nm to 350 nm. The light-emitting layer 40 is preferably provided such that the center emission wavelength is 265 nm or more and 350 nm or less.

Here, the light emitting layer 40 may be composed of a single layer, but preferably has a multiple quantum well (MQW) structure in which well layers 41 and barrier layers 42 made of AlGaN of different Al composition ratios are repeatedly formed. The layer(s) to emit deep ultraviolet light is the light-emitting layer per se in the case of the single layer structure, or are well layers 41 in the case of the multiple quantum well structure.

The Al composition ratio w of the layer to emit deep ultraviolet light is adjusted such that the deep ultraviolet light has wavelengths of 200 nm to 350 nm in the deep ultraviolet light range or a center emission wavelength is 265 nm or more and 350 nm or less. Such an Al composition ratio w may range from 0.3 to 0.6. In the case of multiple quantum well structure, the Al composition ratio b of the barrier layers 42 is adjusted to be higher than the Al composition ratio w of the well layers 41. For example, provided that b>w, the Al composition ratio b of the barrier layers 42 can range from 0.40 to 0.95. Further, the number of repetitions of the well layers 41 and the barrier layers 42 is not limited in particular, and can be for example one to ten. The layers on both ends of the light emitting layer 40 in the thickness direction (i.e., the top and bottom layers) are preferably barrier layers. Accordingly, when the number of repetitions of the well layers 41 and the barrier layers 42 is n, those layers are referred to as "n·5 pairs of well layers and barrier layers". The thickness of the well layers 41 can be 0.5 nm to 5 nm, and the thickness of the barrier layers 42 can be 3 nm to 30 nm.

<p-Type First Layer>

Figure 4A:
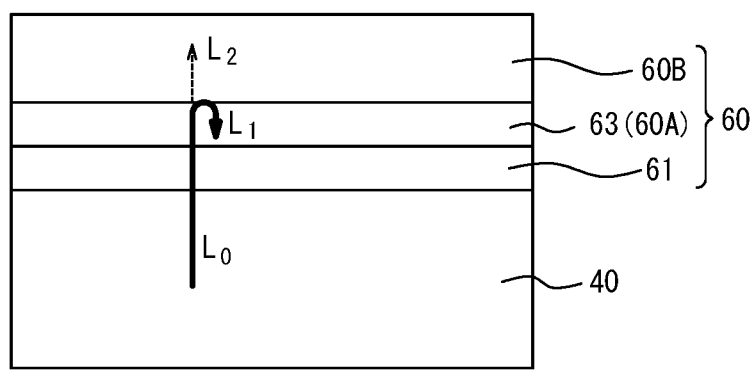
FIG. 4A is a schematic cross-sectional view illustrating a mode of a first p-type semiconductor layer 60A in the deep ultraviolet light emitting element 100 according to an embodiment of this disclosure.
Figure 4B:
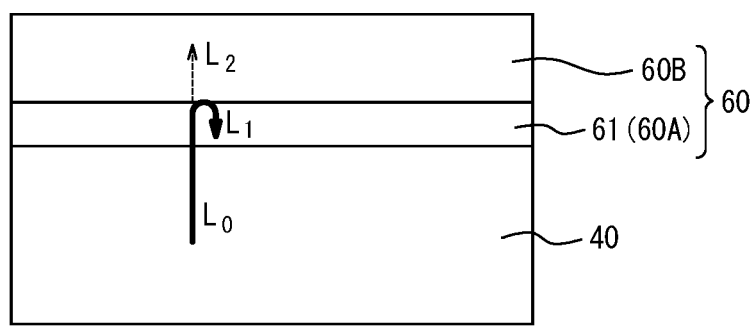
FIG. 4B is a schematic cross-sectional view illustrating another mode of a first p-type semiconductor layer 60A in the deep ultraviolet light emitting element 100 according to an embodiment of this disclosure.

The p-type semiconductor layers 60 can be provided on the light-emitting layer 40 in the modes illustrated in FIGS. 4A and 4B. Referring to FIG. 4A, the p-type semiconductor layers 60, comprising a p-type electron blocking layer 61, a p-type cladding layer 63, and the p-type contact layer 60B, in this order, may be formed on the light-emitting layer 40. In contrast to FIG. 4A, referring FIG. 4B, the p-type semiconductor layers 60, comprising a p-type electron blocking layer 61 and a p-type contact layer 60B, in this order, may be formed on the light-emitting layer 40, without providing the p-type cladding layer 63.

In the mode illustrated in FIG. 4A, the p-type cladding layer 63 represents the p-type first layer 60A in the present embodiment. Deep ultraviolet light $L_0$ emitted from the light-emitting layer 40 is reflected by the interface of the p-type first layer 60A and the p-type contact layer 60B (i.e., interface of the p-type cladding layer 63 and the p-type contact layer 60B), and the reflected light component $L_1$ advances toward the light-emitting layer 40 (in other words, toward the substrate 10). The non-reflected light component $L_2$ advances toward the p-type contact layer 60B and passes through the p-type contact layer 60B and/or is absorbed in the p-type contact layer 60B.

In the mode illustrated in FIG. 4B, on the other hand, the p-type electron blocking layer 61 represents the p-type first layer 60A in the present embodiment. Deep ultraviolet light $L_0$ emitted from the light-emitting layer 40 is reflected by the interface of the p-type first layer 60A and the p-type contact layer 60B (i.e., the interface of the p-type electron blocking layer 61 and the p-type contact layer 60B), and the reflected light component $L_1$ advances toward the light-emitting layer 40 (in other words, toward the substrate 10). The non-reflected light component $L_2$ advances toward the p-type contact layer 60B and passes through the p-type contact layer 60B and/or is absorbed in the p-type contact layer 60B.

Figure 5:
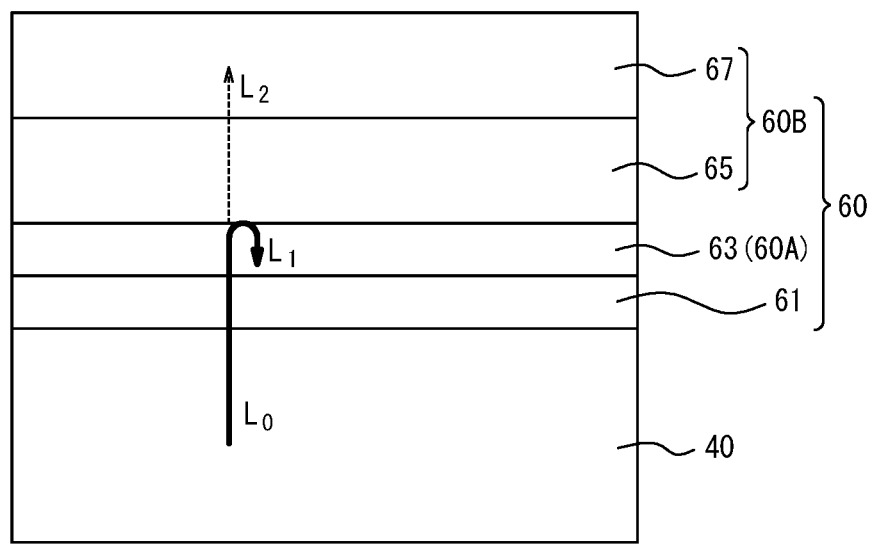
FIG. 5 is a schematic cross-sectional view illustrating a still another mode of p-type semiconductor layers 60 in the deep ultraviolet light emitting element 100 according to an embodiment of this disclosure.

In either case, the layer directly in contact with the p-type contact layer 60B represents the p-type first layer 60A that is made of p-type $Al_xGa_{1-x}N$ having an Al composition ratio x higher than an Al composition ratio of a layer(s) to emit the deep ultraviolet light in the light-emitting layer 40. Alternatively, referring to FIG. 5, the p-type contact layer 60B may have a multi-layered structure comprising a p-type first contact layer 65 and a p-type second contact layer 67, in this order. Also in this case, deep ultraviolet light $L_0$ is reflected by the interface of the p-type first layer 60A and the p-type contact layer 60B. The materials and the thicknesses of the p-type first contact layer 65 and the p-type second contact layer 67 in the p-type contact layer 60B may be selected as appropriate such that the interface of the contact layer 65 and the p-type second contact layer 67 also reflects light.

The p-type electron blocking layer 61 is a layer to block flows of electrons and inject the electrons into the light emitting layer 40 (the well layers 41 in the case when the light emitting layer 40 has a multiple quantum well structure) thereby improving the electron injection efficiency. For that purpose, the Al composition ratio z of the p-type electron blocking layer 61 preferably satisfies $0.5 \leq z \leq 1$. Note that when the Al composition ratio z is 0.5 or more, the p-type electron blocking layer 61 may contain up to 5% of In with respect to the amount of the group III elements of Al and Ga. Here, when the light emitting layer 40 has the above-described multiple quantum well structure having the barrier layers 42, preferably the Al composition ratio z satisfies the above conditions and is higher than the Al composition ratio b of the barrier layers 42. In other word, $z > b$ is satisfied. When the p-type electron blocking layer 61 is in contact with the p-type contact layer 60B (in other words, in the absence of a p-type cladding layer), the Al composition ratio of the layer in the p-type electron blocking layer 61 which is closest to the p-type contact layer 60B and is in contact with the p-type contact layer 60B is regarded as the p-type first layer 60A made of $Al_xGa_{1-x}N$ having the Al composition ratio x. (In other words, Al composition ratio z is treated as the Al composition ratio x in this case.)

The thickness of the p-type electron blocking layer 61 is preferably, but not limited to, 10 nm to 80 nm, for example. The thickness of the p-type electron blocking layer 61 in this range ensures a high light output power. Note that the p-type electron blocking layer 61 is preferably thicker than the barrier layers 42. Examples of p-type dopants doped in the p-type electron blocking layer 61 include magnesium (Mg), zinc (Zn), calcium (Ca), beryllium (Be), and manganese (Mn), and Mg is typically used. The dopant concentration of the p-type electron blocking layer 61 is not particularly limited as long as the layer can serve as a p-type semiconductor layer, and can be $1.0 \times 10^{18}$ atoms/cm$^3$ to $5.0 \times 10^{21}$ atoms/cm$^3$, for example.

In addition, the p-type cladding layer 63 is a layer having an Al composition ratio that is higher than the Al composition ratio of the layer to emit deep ultraviolet light in the light-emitting layer 40, and but is lower than the Al composition ratio z of the p-type electron blocking layer 61. In other words, both the p-type electron blocking layer 61 and the p-type cladding layer 63 are layers that have Al composition ratios higher than the Al composition ratio of the layer(s) to emit deep ultraviolet light, and substantially transmit deep ultraviolet light emitted from the light-emitting layer 40.

When the p-type cladding layer 63 is in contact with the p-type contact layer 60B, the Al composition ratio of the layer in the p-type cladding layer 63 which is closest to the p-type contact layer 60B and is in contact with the p-type contact layer 60B is regarded as the p-type first layer 60A made of $Al_xGa_{1-x}N$ having the Al composition ratio x. The p-type cladding layer 63 may have a single- or multi-layered structure, or may be a composition gradient layer. When the p-type cladding layer 63 has a superlattice laminate structure, an average composition ratio calculated by dividing the sum of the product of the Al composition ratio and the thickness of each layer, by the total thickness, is used as the Al composition ratio of the superlattice laminate.

The mobility of p-type dopants in the p-type first layer 60A to the light-emitting layer 40 may be controlled by locally doping a heterogenous dopant, such as Si, or locally providing undoped regions.

<n-Side Electrode>

The n-side electrode 90 can be provided on an exposed surface of the n-type semiconductor layer 30. The n-side electrode 90 can be formed, for example, as a metal composite film having a Ti-containing film and an Al-containing film formed on the Ti-containing film. In the deep ultraviolet light emitting element 100 illustrated in FIG. 1, parts of the light-emitting layer 40 and the p-type semiconductor layers 60 are removed by etching, for example, and the n-side electrode 90 is provided on the exposed surface of the n-type semiconductor layer 30.

<p-Side Electrode>

The p-side electrode 80 may be formed from well-known materials that are compatible with the material of the p-type contact layer 60B, as described above.

(Method of Manufacturing Deep Ultraviolet Light Emitting Element)

Referring to Steps A-D in FIG. 6, a method of manufacturing a deep ultraviolet light emitting element 100 comprises the steps of forming an n-type semiconductor layer 30 on a substrate 10, forming a light-emitting layer 40 on the n-type semiconductor layer 30, and forming p-type semiconductor layers 60 on the light-emitting layer 40.

The step of forming the p-type semiconductor layers 60 comprises a first step (Step B in FIG. 6) of forming a p-type first layer 60A that is made of p-type $Al_xGa_{1-x}N$ ($0<x\leq1$) having an Al composition ratio x higher than an Al composition ratio of a layer(s) to emit deep ultraviolet light in the light-emitting layer 40, and a second step (Step C in FIG. 6) of forming a p-type contact layer 60B made of a non-nitride p-type group III-V semiconductor material or a p-type group IV semiconductor material by MOCVD.

As described above in embodiment of the deep ultraviolet light emitting element 100, the p-type contact layer 60B is configured to function as a reflective layer to reflect deep ultraviolet light. The reflectance of light at a wavelength of 280 nm incident on the p-type contact layer 60B from the p-type first layer 60A is 10% or higher.

This manufacturing method can enable manufacturing of the deep ultraviolet light emitting element 100 exhibiting both high light output power and an excellent reliability.

Each layer in each step can be formed by a well-known thin film deposition technique, for example, by metalorganic chemical vapor deposition (MOCVD), molecular beam epitaxy (MBE), hydride vapor phase epitaxy (HVPE), or sputtering. For example, each layer is preferably formed by MOCVD. Conditions that are generally used for epitaxial growths of the above-described semiconductor materials by MOCVD can be used for forming the p-type contact layer 60B.

As illustrated in Step A in FIG. 6, upon providing the substrate 10, a sapphire substrate or a single-crystalline AlN substrate may be provided, or an AlN template substrate may be provided. As illustrated in Step D in FIG. 6, a buffer layer 20, a p-side electrode 80, and an n-side electrode 90 can be formed with common techniques.

EXAMPLES

The present disclosure will be described in more detail below using Examples. However, this disclosure is not limited to the following Examples.

Example 1

Initially, an AlN layer having a center thickness of 0.60 μm (average thickness: 0.61 μm) was grown by MOCVD on a sapphire substrate (diameter: 2 inches, thickness: 430 μm, and plane orientation: (0001)) to obtain an AlN template substrate. Upon measuring thicknesses, the thicknesses of total 25 points distributed across the wafer at regular intervals, including the center of the wafer plane, were measured with an interference thickness measurement system (Nanospec M6100A manufactured by Nanometrics Incorporated).

Next, the above AlN template substrate was loaded into a heat treatment furnace. The furnace was purged with nitrogen gas to create a nitrogen gas atmosphere in the furnace, followed by raising the temperature inside the furnace, thus performing heat treatment on the AlN template substrate. The heating temperature was 1650° C. and heating time was four hours.

Subsequently, as a buffer layer, a layer provided with a composition gradient from an undoped $Al_{0.78}Ga_{0.22}N$ to $Al_{0.68}Ga_{0.32}N$ and having a thickness of 1.0 μm was formed by MOCVD. Next, an n-type semiconductor layer made of $Al_{0.65}Ga_{0.35}N$ doped with Si and having a thickness of 1.6 μm was formed on the buffer layer. The Si concentration of the n-type semiconductor layer determined by a SIMS analysis was $2.0\times10^{19}$ atoms/cm$^3$.

Next, on the n-type semiconductor layer, barrier layers made of $Al_{0.65}Ga_{0.35}N$ with a thickness of 7 nm and well layers made of $Al_{0.45}Ga_{0.55}N$ with a thickness of 3 nm were alternately and repeatedly stacked thereby forming a quantum well structure having 3 pairs of the layers, followed by a formation of a 1-nm layer made of AlN, thereby forming a light-emitting layer. The Al composition ratio b was 0.65, and the Al composition ratio w was 0.45. The peak emission wavelength of deep ultraviolet light emitted from the well layers was 280 nm. During the formations of the barrier layers, Si was doped.

Next, a p-type electron blocking layer made of $Al_{0.68}Ga_{0.32}N$ with a thickness of 40 nm and a p-type cladding layer made of $Al_{0.55}Ga_{0.45}N$ with a thickness of 40 nm were formed using hydrogen gas as a carrier gas. The Al composition ratio z was 0.68, and the Al composition ratio x was 0.55. During the formations of the p-type electron blocking layer and the p-type cladding layer, Mg was doped by supplying bis(cyclopentadienyl)magnesium (CP$_2$Mg) gas as a Mg source into the chamber. The Mg concentrations of the p-type electron blocking layer and the p-type cladding layer determined by SIMS analyses were $2.0\times10^{18}$ atoms/cm$^3$ and $2.0\times10^{19}$ atoms/cm$^3$, respectively.

Subsequently, on the p-type cladding layer, a p-type contact layer was formed. In Example 1, the p-type cladding layer represented the p-type first layer. Specifically, on the p-type cladding layer, a p-type single-crystalline GaAs layer doped with C was formed by MOCVD up to a thickness of 1 μm. The reflectance of light at a wavelength of 280 nm incident on GaAs ($n_c=4.02$ and $k_c=2.56$) from $Al_{0.55}Ga_{0.45}N$ ($n_1=2.46$ and $k_1=0.001$) is calculated as 18.5% using the aforementioned Equation (1).

The C concentration of the p-type contact layer determined by a SIMS analysis was $5\times10^{18}$ atoms/cm$^3$.

Thereafter, a part of the n-type semiconductor layer was exposed by dry etching. Then current was supplied through balls with a diameter of 300 μm which were pressed on the portion of the p-type semiconductor layer and the exposed portion of the n-type semiconductor layer, respectively, to thereby evaluate the light output power of the deep ultraviolet light emitting element of Example 1. The layer structure of Example 1 is listed in Table 1.

TABLE 1

|  | Compositions | Dopants | Thicknesses |
| --- | --- | --- | --- |
| p-type contact layer | GaAs | C | 1.0 μm |
| p-type cladding layer | $Al_{0.55}Ga_{0.45}N$ | Mg | 40 nm |
| p-type electron blocking layer | $Al_{0.68}Ga_{0.32}N$ | Mg | 40 nm |
| Light-emitting layer | AlN | — | 1 nm |
|  | $Al_{0.45}Ga_{0.55}N$ | — | 3 nm |

TABLE 1-continued

|  | Compositions | Dopants | Thicknesses |
|---|---|---|---|
|  | $Al_{0.65}Ga_{0.35}N$ | Si | 7 nm |
|  | $Al_{0.45}Ga_{0.55}N$ | — | 3 nm |
|  | $Al_{0.65}Ga_{0.35}N$ | Si | 7 nm |
|  | $Al_{0.45}Ga_{0.55}N$ | — | 3 nm |
|  | $Al_{0.65}Ga_{0.35}N$ | Si | 7 nm |
| n-type semiconductor layer | $Al_{0.65}Ga_{0.35}N$ | Si | 1.6 μm |
| Undoped layer | *1 | — | 1.0 μm |
| AlN layer | AlN | — | 0.6 μm |
| Sapphire substrate | — | — | 430 μm |

*1: The Al composition ratio of the AlN layer was such that the Al composition ratio gradually decreased in the growth direction from 78% on the side of the sapphire substrate ($Al_{0.78}Ga_{0.22}N$) to 68% ($Al_{0.68}Ga_{0.32}N$) on the n-layer surface side.

Comparative Example 1

A deep ultraviolet light emitting element according to Comparative Example 1 was fabricated in the same manner as in Example 1 except that Mg-doped p-type GaN (Mg concentration: $2×10^{19}$ atoms/cm$^3$, thickness: 0.3 μm) was used as a p-type contact layer.

Comparative Example 2

A deep ultraviolet light emitting element according to Comparative Example 2 was fabricated in the same manner as in Example 1 except that no p-type contact layer was provided.

(Evaluation 1: Initial Light Output Power)

Light output powers of the deep ultraviolet light emitting elements of Example 1 and Comparative Examples 1 and 2 were measured using a photodetector disposed on the side of the sapphire surfaces by supplying 100-mA current through the In balls. Assuming the light output power of Comparative Example 1 having the p-type contact layer made of p-type GaN to be 1, the light output of Comparative Example 2 without a p-type contact layer was 2. It is considered that the improved light output power in Comparative Example 2 was achieved by a combined effect of light toward the direction oppose to the sapphire substrate (light back to the sapphire substrate after being reflected by the interfaces of the In electrode, the p-type cladding layer and air) and light from the light-emitting layer toward the sapphire substrate, as compared to Comparative Example 1. Accordingly, it can be considered that the light from the light-emitting layer toward the p-type contact layer was not reflected by the p-type GaN in Comparative Example 1, and nearly 100% of the light was absorbed.

The p-type contact layer, on the other hand, was made from p-type GaAs. Assuming the light output power of Comparative Example 1 to be 1, the light output power in this case was 1.1. In other words, it was a 10% improvement over Comparative Example 1. It is considered that this improvement was achieved by the p-type GaAs that reflected about 10% of light emitted from the light-emitting layer toward the p-type contact layer. It is considered that the non-reflected light component was absorbed by the p-type GaAs layer. The results are listed in Table 2.

(Evaluation 2: Time Deviation of Light Output Power)

For each wafer of Example 1 and Comparative Examples 1 and 2, light output power was measured by supplying 100-mA current for 1 minute at five points. The light output power exhibited no deviation at all of the 5 points in Example 1 and Comparative Example 1. In contrast, in Comparative Example 2 (without a contact layer), light extinctions were observed at 3 points, and the light output power reduced by 20% after 1 minute compared to the light output power immediately after the energization at the remaining 2 points. The results are listed in Table 2.

It is hypothesized that the aging effect in Comparative Example 2 was caused by degradation of the contact of the p-type cladding layer with the p-side electrode, on which the In ball was pressed, which was induced by the low hole density due to the high Al composition ratio in the p-type cladding layer; or a localized concentration of the current.

TABLE 2

|  | p-type contact layer | Initial light output power (Relative value to Comparative Example 1) | Time deviation of light output power |
|---|---|---|---|
| Example 1 | p-type GaAs | 1.1 | No change at 5 points |
| Comparative Example 1 | p-type GaN | 1 | No change at 5 points |
| Comparative Example 2 | none *2 | 2 | Not lit at 3 points, and 20% reduction at 2 points |

*2 In ball was directly applied on the p-type cladding layer.

INDUSTRIAL APPLICABILITY

In accordance with the present disclosure, a deep ultraviolet light emitting element that exhibits both high light output power and an excellent reliability, and a method of manufacturing the same are provided.

REFERENCE SIGNS LIST

10 Substrate
20 Buffer layer
30 n-type semiconductor layer
40 Light-emitting layer
41 Well layer
42 Barrier layer
60 p-type semiconductor layers
60A p-type first layer
60B p-type contact layer
61 Electron blocking layer
63 p-type cladding layer
65 p-type first contact layer
67 p-type second contact layer
70 Metal reflective layer
80 n-side electrode
90 p-side electrode
100 Deep ultraviolet light emitting element

The invention claimed is:

1. A deep ultraviolet light emitting element comprising, in an order:
   a substrate;
   an n-type semiconductor layer;
   a light-emitting layer configured to emit deep ultraviolet light having a peak emission wavelength in a range of 200 nm or more and 350 nm or less; and
   p-type semiconductor layers, comprising:
   a p-type first layer that is made of p-type $Al_xGa_{1-x}N$ having an Al composition ratio x ($0<x≤1$) higher than an Al composition ratio of a layer to emit the deep ultraviolet light in the light-emitting layer; and
   a p-type contact layer directly on the p-type first layer, the p-type contact layer being made of a non-nitride p-type group III-V semiconductor material or a p-type group IV semiconductor material, the p-type contact layer having a thickness of 1000 nm or more and 3000 nm or less, wherein the p-type contact layer has a reflectance of the deep ultraviolet light at a wavelength of 280 nm incident on the p-type contact layer from the p-type first layer being 10% or higher.

2. A deep ultraviolet light emitting element comprising, in an order:

a substrate;

an n-type semiconductor layer;

a light-emitting layer configured to emit deep ultraviolet light having a peak emission wavelength in a range of 200 nm or more and 350 nm or less; and p-type semiconductor layers, comprising:

a p-type first layer that is made of p-type $Al_xGa_{1-x}N$ having an Al composition ratio x ($0<x\leq1$) higher than an Al composition ratio of a layer to emit the deep ultraviolet light in the light-emitting layer;

a p-type contact layer directly on the p-type first layer, the p-type contact layer being made of a non-nitride p-type group III-V semiconductor material or a p-type group IV semiconductor material, the p-type contact layer having a thickness of 1 nm or more and 10 nm or less, and a metal reflective layer provided on the p-type contact layer, the metal reflective layer comprising Rh, the metal reflective layer having a thickness of 10 nm or more and 500 nm or less, wherein the p-type contact layer has a reflectance of the deep ultraviolet light at a wavelength of 280 nm incident on the p-type contact layer from the p-type first layer being 10% or higher.

3. The deep ultraviolet light emitting element of claim 1, wherein the substrate is a sapphire substrate, an AlN template substrate, or a single-crystalline AlN substrate.

4. A method of manufacturing a deep ultraviolet light emitting element that is configured to emit deep ultraviolet light having a peak emission wavelength in a range of 200 nm or more and 350 nm or less, the method comprising the steps of:

forming an n-type semiconductor layer on a substrate forming a light-emitting layer on the n-type semiconductor layer; and forming p-type semiconductor layers on the light-emitting layer, the step of forming the p-type semiconductor layers comprising:

a first step of forming a p-type first layer that is made of p-type $Al_xGa_{1-x}N$ having an Al composition ratio x ($0<x\leq1$) higher than an Al composition ratio of a layer to emit the deep ultraviolet light in the light-emitting layer; and a second step of forming, on the p-type first layer, a p-type contact layer made of a non-nitride p-type group III-V semiconductor material or a p-type group IV semiconductor material by MOCVD, the p-type contact layer having a thickness of 1000 nm or more and 3000 nm or less, wherein the p-type contact layer has a reflectance of the deep ultraviolet light at a wavelength of 280 nm incident on the p-type contact layer from the p-type first layer being 10% or higher.

5. The deep ultraviolet light emitting element of claim 1, wherein the p-type contact layer has a reflectance of the deep ultraviolet light at a wavelength of 280 nm incident on the p-type contact layer from the p-type first layer being 15% or higher.

6. The deep ultraviolet light emitting element of claim 2, wherein the substrate is a sapphire substrate, an AlN template substrate, or a single-crystalline AlN substrate.

* * * * *